(12) United States Patent
Tamura

(10) Patent No.: US 7,163,879 B2
(45) Date of Patent: Jan. 16, 2007

(54) HARD MASK ETCH FOR GATE POLYETCH

(75) Inventor: Koji Tamura, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/157,192

(22) Filed: May 30, 2002

(65) Prior Publication Data
US 2003/0222287 A1 Dec. 4, 2003

(51) Int. Cl.
H01L 21/3205 (2006.01)
H01L 21/302 (2006.01)
H01L 21/31 (2006.01)

(52) U.S. Cl. .................. 438/585; 438/721; 438/791; 438/952; 257/E21.206; 257/E21.029; 257/E21.038

(58) Field of Classification Search ............... 438/303, 438/305, 585, 791, 592, 790, 783, 952, 258, 438/259, 721; 257/E21.206, E21.029, E21.028
See application file for complete search history.

(56) References Cited
U.S. PATENT DOCUMENTS
5,891,784 A * 4/1999 Cheung et al. ............. 438/303
6,083,852 A * 7/2000 Cheung et al. ............. 438/791
6,136,679 A * 10/2000 Yu et al. ..................... 438/592
6,174,818 B1 * 1/2001 Tao et al. .................... 438/733
6,355,546 B1 * 3/2002 Huang et al. ............... 438/585
6,670,277 B1 * 12/2003 Sayama et al. ............. 438/706

FOREIGN PATENT DOCUMENTS
JP 2000-100965 A 4/2000

* cited by examiner

Primary Examiner—Walter Lindsay, Jr.
Assistant Examiner—Ron Pompey
(74) Attorney, Agent, or Firm—Birch, Stewart Kolasch & Birch, LLP

(57) ABSTRACT

A transistor gate structure that is free from notches is formed by using a hard mask. The hard mask has a bilayer structure of a BARC (bottom antireflective coating) over a silicon dioxide layer. A photoresist layer is formed over a portion corresponding to the gates. A first etch forms the gate structure. Following removal of the photoresist, a second etch completely removes the BARC. The silicon dioxide layer can be removed by a subsequent wet etch with HF.

13 Claims, 10 Drawing Sheets

HARD MASK ETCH FOR GATE POLYETCH

FIELD OF THE INVENTION

The invention pertains to the avoidance of shape defects that occur when a gate electrode is formed.

BACKGROUND OF THE INVENTION

Recent advances in MOS LSI (metal oxide semiconductor large scale integration) has pushed semiconductor technology to the 0.18 μm geometry and beyond. Transistor manufacturing methods are adopting patterning methods that use an inorganic antireflective film formed from such materials as silicon oxynitride (SiON) and a dual gate process that prevents depletion of the gate electrode.

When a gate electrode is patterned using an antireflective film, it becomes necessary to remove the antireflective film from the polycrystalline silicon (also referred to as poly-Si) gate electrode after etching the gate. A hot phosphoric acid solution is generally used for this removal. However, when a poly-Si gate that has been implanted with phosphorous in a dual gate process is etched, shape defects result.

The shape defects associated with the conventional art etch process are shown in FIG. 7, which is an SEM (scanning electron microscope) photomicrograph of a gate cross section of a FET (field effect transistor). The notching in the gate is clearly evident.

The conventional technology for manufacturing a semiconductor device having a gate is typified by Takegawa et al., Japanese Patent 2000100965, published Apr. 7, 2000. In Takegawa, as is shown in FIG. 1, a compensating film 51 is formed on a hard mask 41 used for etching a gate electrode 30. The structure of the semiconductor device also includes a SI substrate 10, an oxide layer 20, a poly-Si layer 31 and a WSi$_2$ layer 32. The compensating film 51 is formed of poly-Si, which is the same as the poly-Si used to form the gate electrode 30. As shown in FIG. 2, the compensating film 51 is completely removed while the etching is carried out. The hard mask 41 is not exposed to the etching gas and is therefore prevented from being thinned while etching is performed. The mask 41 prevents ions from penetrating it during ion injection. However, Takegawa fails to offer any technology to prevent the formation of notches in the gate.

In the conventional gate formation technologies, the defects that can occur depend on the type of etching process. Wet etching with phosphoric acid (H$_3$PO$_4$) can result in the formation of a notch in the gate, and the notch will result in high resistivity and degradation of the transistor. Although notch formation can be prevented, to an extent, by the application of a layer of photoresist, the photoresist has a limited effectiveness in preventing notch formation. The application of photoresist also entails additional process steps and reagent cost that result in a less economically viable transistor manufacturing process.

On the other hand, a dry etching process tends to form recesses in the silicon. These recesses will result in a degradation of the transistor. As a result, both wet and dry etching to form a gate structure pose numerous difficulties in the conventional art.

As has been discussed above, the conventional gate manufacturing technology tends to form unacceptable notching in the gate during the etching process. Accordingly, new technologies are required for the 0.18 μm geometry and beyond.

SUMMARY OF THE INVENTION

The invention, in part, pertains to a TFT gate free from notching and less than about 50 Å undercutting and a method of forming the gate.

The invention, in part, pertains a method of manufacturing a semiconductor device by forming an oxide layer over a substrate, forming a silicon layer over the oxide layer, forming a hard mask over the silicon layer, forming a layer of photoresist over a portion of the silicon layer corresponding to a gate, etching, removing the photoresist and performing a second etching. The etching steps can be a dry etch. The substrate can be silicon, and the oxide layer can be silicon oxide The invention, in part, pertains to the hard mask being an antireflective coating over a layer of silicon oxide. The antireflective coating can be silicon oxynitride. The second etching removes the antireflective coating.

The invention, in part, pertains to the silicon layer being non-doped or n-doped poly-Si. The silicon layer can have a thickness of about 2000 Å. The photoresist is preferably a 248 nm photoresist. The layer of silicon oxide has a thickness of about 300–700 Å. The antireflective coating has a thickness of about 300–700 Å.

The invention, in part, pertains to a semiconductor device that is an oxide layer over a substrate, a silicon layer over the oxide layer, the silicon layer having a notch-free structure, and the gate structure has been formed using a hard mask comprising an antireflective layer over a silicon oxide layer, the mask having been subsequently removed.

It is to be understood that both the foregoing general description and the following detailed description are exemplary and explanatory and are intended to provide further explanation of the invention as claimed.

BRIEF DESCRIPTION OF THE DRAWINGS

The accompanying drawings are included to provide a further understanding of the invention. The drawings illustrate embodiments of the invention and together with the description serve to explain the principles of the embodiments of the invention.

DETAILED DESCRIPTION

Advantages of the present invention will become more apparent from the detailed description given herein after. However, it should be understood that the detailed description and specific examples, while indicating preferred embodiments of the invention, are given by way of illustration only, since various changes and modifications within the spirit and scope of the invention will become apparent to those skilled in the art from this detailed description.

The invention avoids shape defects in gate formation by utilizing a hard mask having a 2-layer structure. The 2-layer structure comprises an inorganic antireflective film (ARC) over a silicon oxide film. An example of the inorganic reflective film can be, but is not restricted to silicon oxynitride (SiON).

In the invention, the inorganic antireflective film, that constitutes the upper layer of the hard mask, is simultaneously removed when the gate poly-Si is etched. Consequently, only the silicon oxide film remains on the gate poly-Si after gate etching. The silicon oxide film can be removed in a subsequent step using hydrofluoric acid or other liquid etchant without etching the phosphorous-implanted poly-Si. As a result, the shape defects associated with the conventional technology can be avoided.

Figure 1:
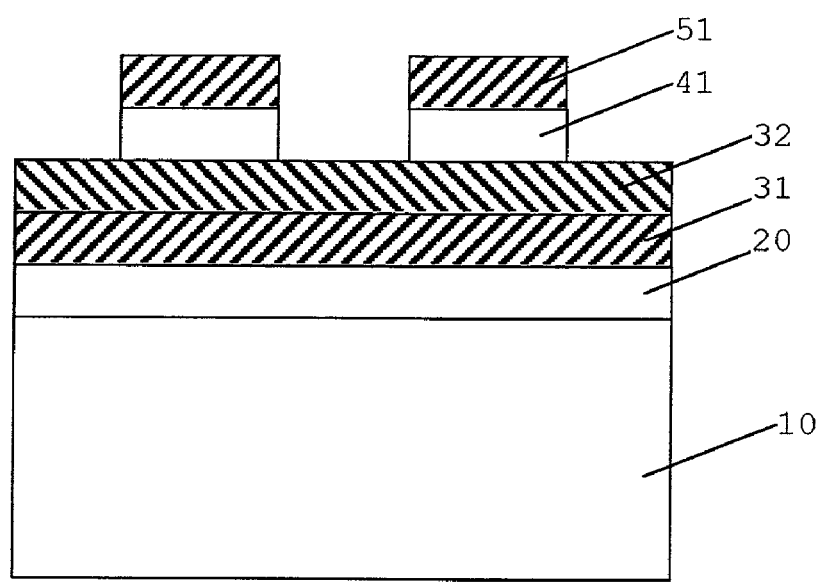
FIG. 1 shows a semiconductor device formed according to the conventional art.
Figure 2:
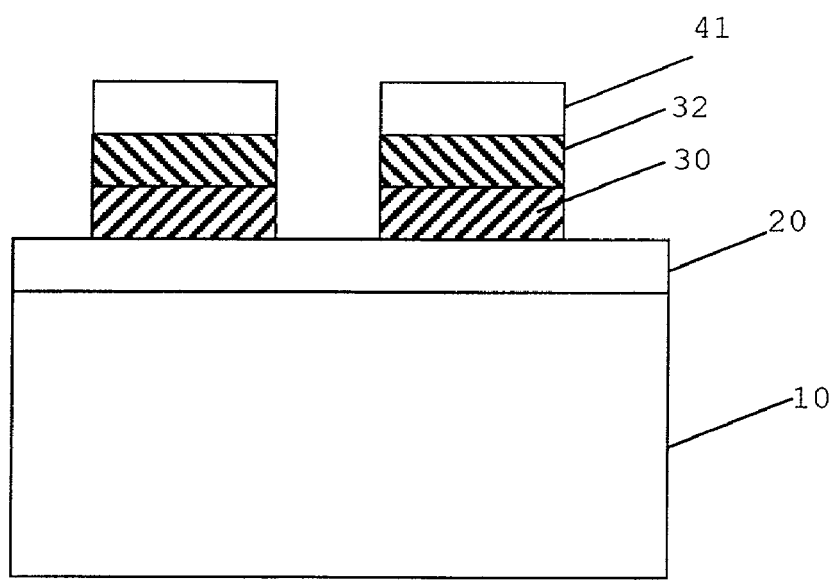
FIG. 2 shows a further processed semiconductor device formed according to the conventional art.
Figure 3:
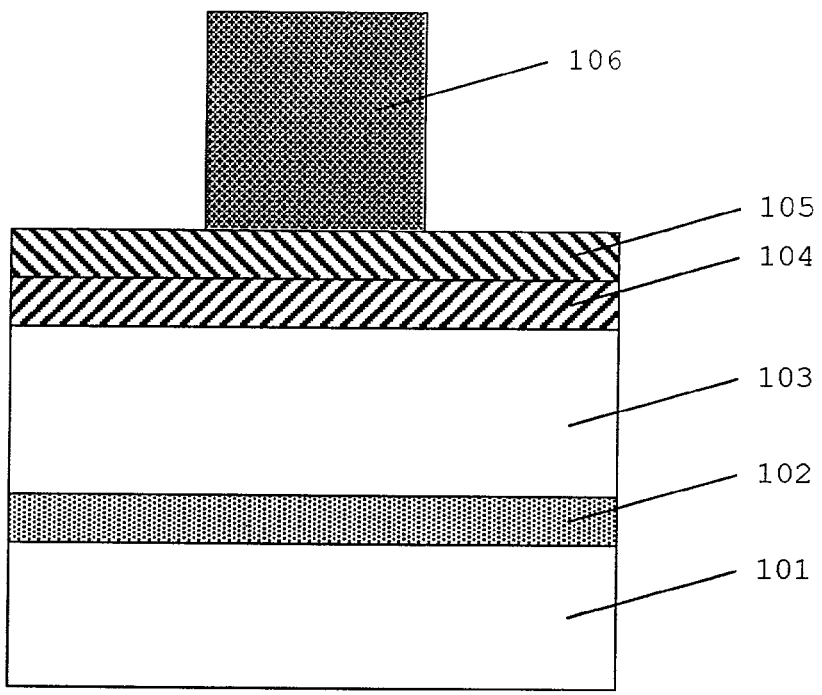
FIG. 3 shows a hard mask process according to an embodiment of the invention.

FIG. 3 shows a hard mask process according to an embodiment of the invention. Over a silicon substrate 101 is formed a gate oxide film 102. Over the gate oxide film 102 is a poly-Si layer 103. The poly-Si layer 103 can be non-doped or n-doped. Over the poly-Si layer 103 is a hard mask comprising a silicon oxide film 104 over which is a BARC (bottom antireflective coating) 105. Over the BARC 105 is a layer of photoresist 106 covering a portion of the structure where a gate is to be formed.

The BARC 105 is, in part, to reduce undesirable reflections. The BARC can be either organic or inorganic. In the invention, the BARC is preferably an inorganic ARC such as silicon oxynitride. The BARC layer 105 can also be, but is not restricted to $Ta_2O_5$, PMMA (polymethyl methacrylate) and polycarbonate.

The photoresist 106 can be a positive or negative photoresist. The positive photoresist can be, for example, a phenol-formaldehyde resin, also referred to as novolak. The photoresist can contain a sensitizer such as diazonaphthoquinone. The photoresist can be, for example, a chemically amplified photoresist containing an acid generator. The photoresist can be a DUV (deep ultraviolet) photoresist based on, for example, tert-butoxycarbonyl, polyhydroxy styrene, phenolic resin, or PMMA (polymethyl methacrylate). The photoresist can be diluted with a solvent such as EGMEA (ethyleneglycol monomethylether acetate) or PGMEA (propyleneglycol monomethylether acetate). The photoresist is preferably a 248 nm or 193 nm photoresist, i.e., photoresists that have a poor resistance to plasma. Most preferably, a 248 nm photoresist is used.

The thicknesses of the layers shown in FIG. 3 can vary, depending on the process parameters. The poly-Si layer 103 can have a thickness of about 2000 Å. Preferably, the poly-Si layer 103 has a thickness of about 1750±50 Å. The silicon oxide film 104 can be from about 300–700 Å in thickness. Typical values for the silicon oxide film 104 are about 590 Å or about 640 Å, but are not restricted to these values. The BARC film 105 can be from about 300–700 Å in thickness. Typical values for the BARC film 105 are about 510 Å or about 620 Å, but are not restricted to these values. The photoresist layer 103 can have a thickness of more than about 1000 Å. Preferably, the photoresist layer 103 can have a thickness of about 4000 Å.

Figure 4:
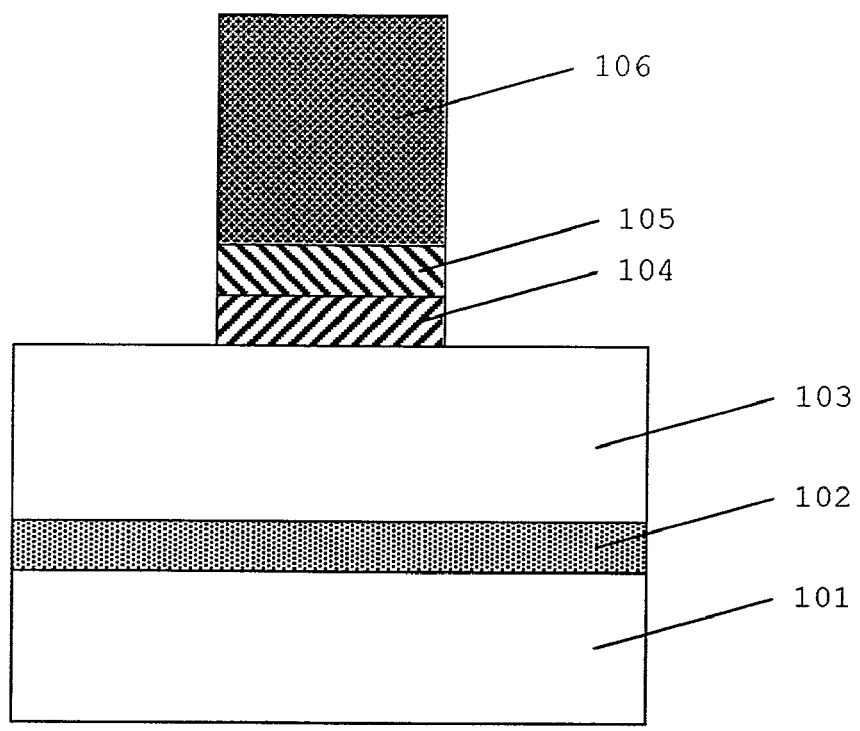
FIG. 4 shows the removal of the BARC film and the silicon dioxide film according to an embodiment of the invention.

FIG. 4 shows the removal of the BARC film 105 and the silicon dioxide film 104 except at the portion covered by the photoresist layer 106. This is accomplished using a dry etch such as a plasma etch. The anisotropic plasma etch used high powered radio frequency (RF) energy to ionize a gas, typically fluorine or chlorine, inside a vacuum process chamber. After the etch, the photoresist layer 106 is stripped.

Figure 5:
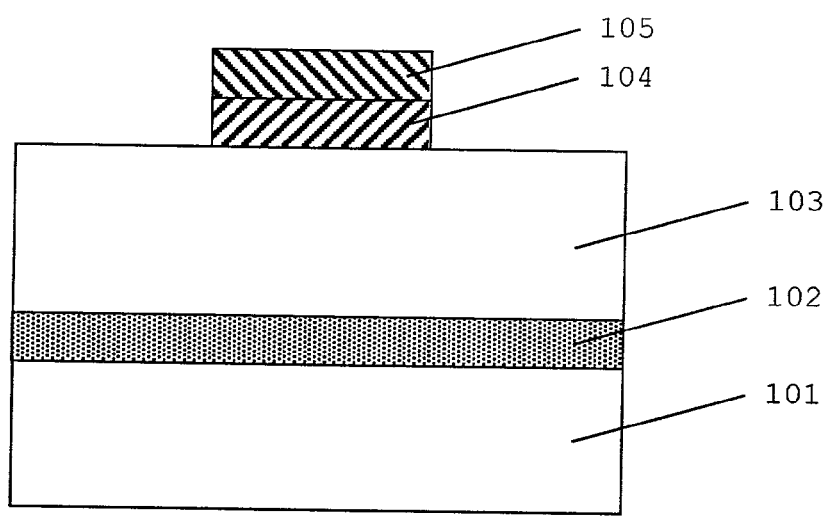
FIG. 5 shows the structure following the stripping of the photoresist layer according to an embodiment of the invention.

FIG. 5 shows the structure following the stripping of the photoresist layer 106. After the photoresist is stripped, a hard mask structure comprising the silicon oxide layer 104 and the BARC layer 105 remains over the portion of the poly-Si layer 103 corresponding to a gate structure.

Figure 6:
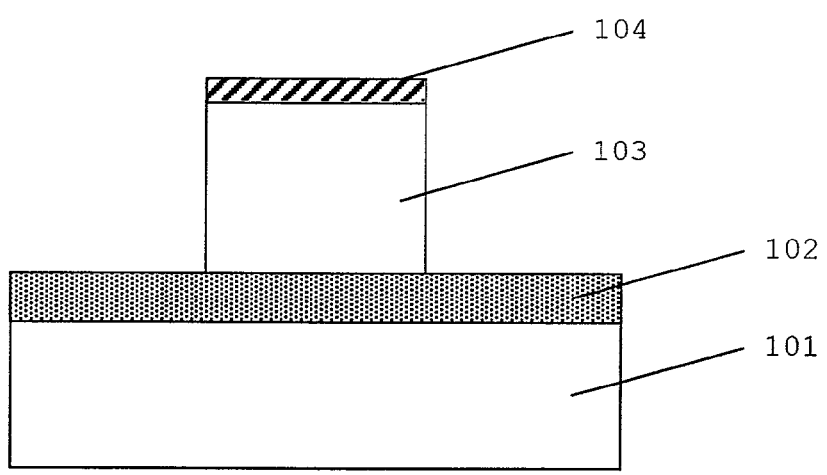
FIG. 6 shows the gate etch of the semiconductor device according to an embodiment of the invention.

FIG. 6 shows the gate etch of the semiconductor device. The BARC layer 105 is completely removed during the gate etch of the poly-Si layer 103. The gate etch is preferably a dry etch. As a result, the removal of the BARC layer 105 eliminates the possibility of notch formation. Following the etch, the residual silicon oxide layer 104 can be removed in s subsequent step using a solution containing hydrofluoric acid.

Oxide can be wet etched by hydrofluoric acid (HF) Selective oxide removal is performed by spraying or immersing the wafer in a dilute solution of HF. The dilute solution of HF is frequently buffered with ammonium fluoride ($NH_4F$). This solution is referred to as buffered oxide etch (BOE). Buffering the HF provides a well controlled etch solution that slows and stabilizes the etch and does not appreciably attack photoresist. The BOE is rinsed from the wafer with deionized water.

Silicon oxide is an amorphous material that etches isotropically when exposed to BOE. That is, the depth of the etch is accompanied by a lateral etch under the mask material. The lateral etching, i.e., undercutting, serves to limit the density of lines and spaces that can be achieved.

Dry etching can be either an isotropic or an anisotropic process. One dry etch process is RIE (reactive ion etch). RIE (reactive ion etch) uses a radio frequency signal to generate a plasma of chemically reactive gas to etch the substrate. Because the substrate is placed directly onto the cathode, momentum transfer plays a significant role in the etching process. Thus by varying the process parameters, etching may be performed either isotropically or anisotropically. RIE can be performed using chemistries based upon $SF_6$. RIE has a low selectivity for silicon.

ICP (inductively coupled plasma) etching is a method of anisotropic plasma etching to provide laterally defined recess structures through an etching mask employing a plasma. ICP-etching includes plasma etching by contact with a reactive etchant gas to remove material from the surface of the substrate and provide exposed surfaces. ICP etching uses chemistries based upon $Cl_2$ and HBr.

Photoresist removal can be accomplished by ashing. Ashing removes the resist layer by reacting atomic oxygen with the resist material in a plasma environment. There are frequently gases such as $N_2$ or $H_2$ added to improve ash performance and to enhance the removal of polymeric residues. Photoresist can also be removed using wet chemical methods.

The following examples illustrate the advantages of embodiments the present invention compared to the conventional art.

EXAMPLE 1

Figure 7:
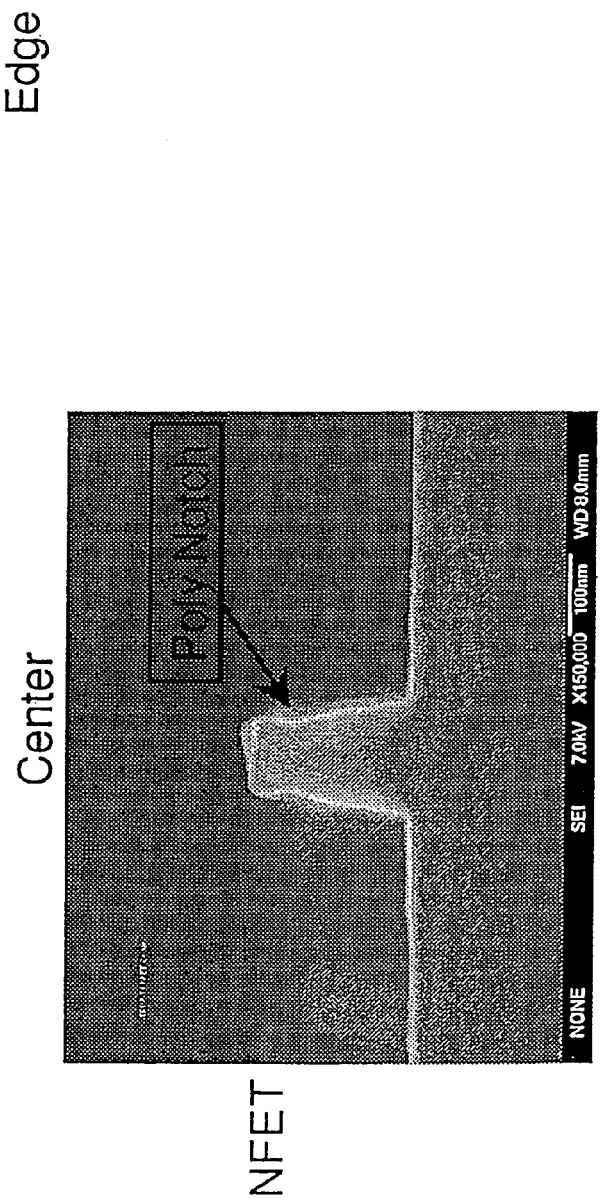
FIG. 7 is an electron photomicrograph of a FET having a notched gate structure formed according to the conventional art.

A conventional art gate on a NFET was formed having a single BARC layer on a poly-Si gate structure portion. The BARC was a 520 Å layer of SiON. Etching was performed with an 85% solution of $H_3PO_4$ at 165° C. for 9 minutes. The results are shown in FIG. 7, which is an electron photomicrograph of the gate.

The results for the conventional art wet etch are an etch rate of 58 Å to yield an etch uniformity of 8.5%. The etch selectivity to Poly-Si was 36, and the selectivity (value of the ratio of etch rate) to USG (undoped silicate glass) was 14.5

EXAMPLE 2

Example 2 is a conventional art etch of a NFET gate structure having a single BARC layer on a poly-Si gate structure portion. The dry etch was performed at $CHF_3/Ar$ ratio of 10/50 sccm (standard cubic centimeters per minute) at a pressure of 35 mTorr and RF=200 W. The results are shown in FIG. 8, a TEM (transmission electron microscopy) photomicrograph.

Figure 8:
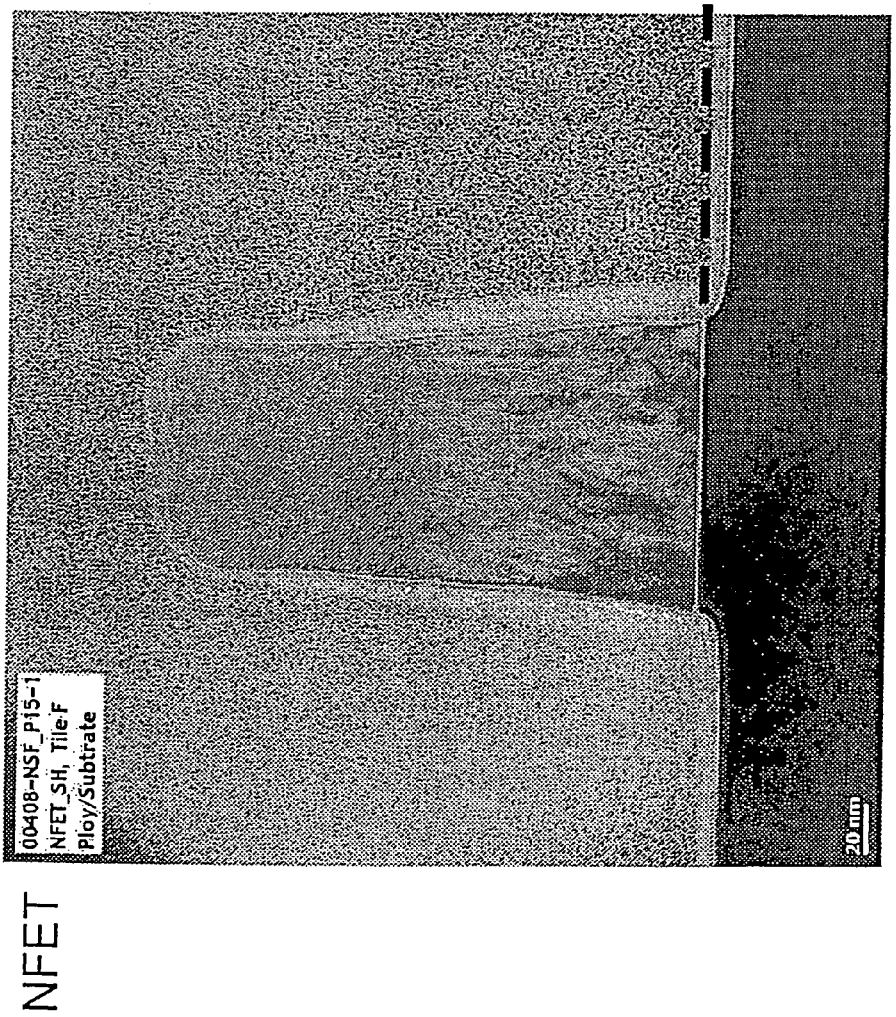
FIG. 8 is an electron photomicrograph of a FET having an undercut gate structure formed according to the conventional art.

The gate structure in FIG. 8 shows a poly-Si gate structure having a size of 2000 Å. However an 80 Å Si recess is observed at the base of the gate. This recess, i.e., undercutting of the Si substrate, causes unreliability and deleterious electrical properties in the FET.

EXAMPLE 3

A gate having a hardmask is formed according to the invention. The hardmask has a BARC (SiON) layer over an $SiO_2$ layer.

For the etch sequence, the following parameters are defined:

HM: Hardmask. The HM means the SiON/Oxide film stack.
B.T.: Breakthrough. B.T. is the name of etching step which has low Poly-Si/Oxide etch selectivity. Generally, this step is used at the beginning of gate etch sequence, because the gas chemistry for gate poly-Si etching has high selectivity to oxide, which easily causes etch stop issues during etching native oxide at the top of poly-Si film. So, the breakthrough step is usually used to remove native oxide on the poly-Si surface.
M.E.: Main Etch. The M.E. is an etch step that controls the profile of the gate.
S.L.: Soft Landing. The S.L. is also an etch step. The S.L. is used to stop gate poly-Si etching on the thin gate oxide underneath, and to simultaneously control the profile of the gate bottom.
O.E.: Over Etch. The O.E. is the etching step to remove the residual poly-Si after S.L. step.
EPD: End Point Detection. The EPD is the system to control etching time automatically and accurately. This system monitors the intensity of light emission from plasma during etching, and detects the end of etching of particular film from the changing of the emission intensity. This system is generally used for etching process.
Ws: Source Power. The Ws is the RF(Radio Frequency) power to generate plasma.
Wb: Bias Power. The Wb is the RF(Radio Frequency) power to control incident energy of ions to wafer.

In this example, the etch sequence is as follows:
1. Hard Mask (HM) etch,
2. Photoresist removal (conventional oxygen plasma etching is used), and
3. Gate poly-Si formation.

Four etch steps were used to form the gate (B.T.→M.E.→S.L.→O.E.). The mask is etched according to the following sequence: HM (80 $CF_4$/120 Ar, 4 mTorr, 500 Ws/150 Wb, 8 Torr Back-He, EPD 25% O.E.), B.T. (65 $CF_4$, 4 mTorr, 650 Ws/100 Wb, 8 Torr Back He, 10 sec.), M.E. (60 $Cl_2$/100 Br/16$HeO_2$/25$CF_4$, 4 mTorr, 400 Ws/120 Wb, 8 Torr Back-He, 18 sec.), S.L. (140 HBr/7 $HeO_2$, 4 mTorr, 500 Ws/30 Wb, 8 Torr Back-He, EPD Just) and O.E. (120 HBr/7$HeO_2$, 70 mTorr, 600 Ws/150 Wb, 8 Torr Back-He, 30 sec.). The results are shown in FIGS. 9a and 9b.

Figures 9A, 9B:
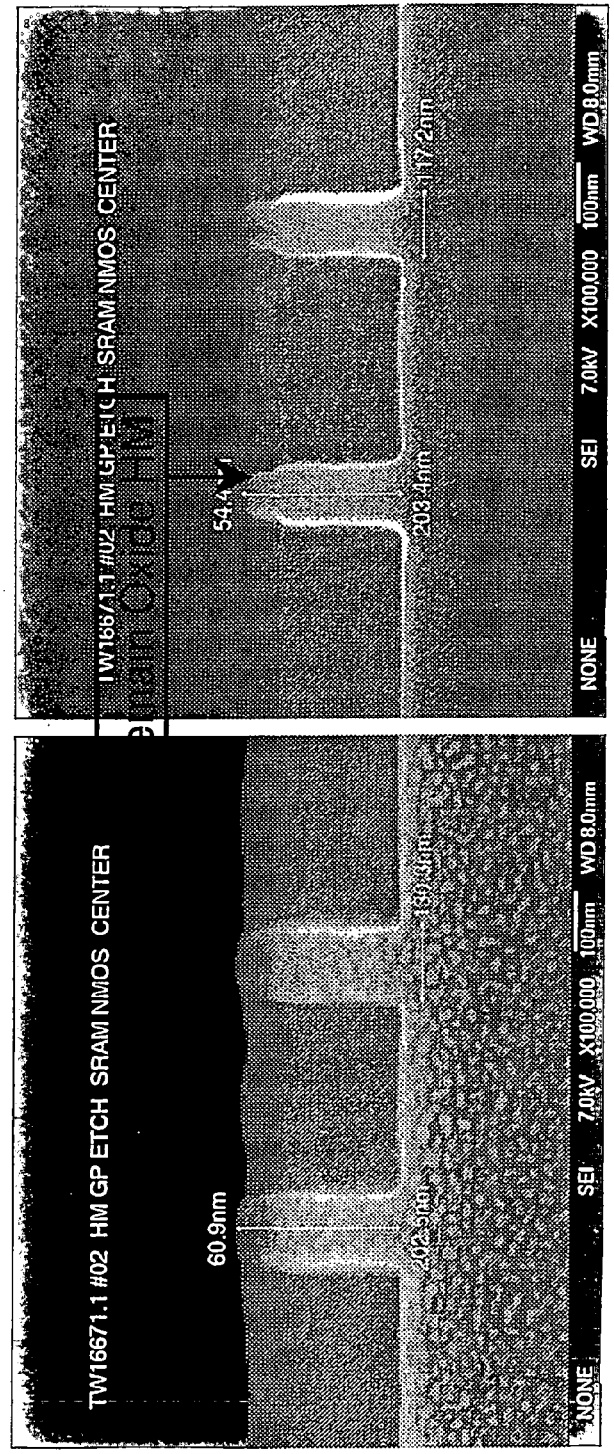
FIGS. 9a and 9b are electron photomicrographs of gates formed according to an embodiment of the invention.

The results in FIGS. 9a and 9b show the gate structure formed according to the invention. A typical gate structure has dimensions of about 202.5 nm by 60.9 nm. FIG. 9b shows a gate structure having a 54.4 nm residual hard mask oxide layer on the gate structure.

The residual hard mask oxide is removed by etching. The residual oxide hard mask is removed by wet etch after gate formation, for example, hydrofluoric acid which doesn't cause poly notch. The need is to minimize both "poly notch" and substrate loss that can cause serious degradation to the transistor. Poly notch is caused by Phosphoric acid during SiON BARC removal after gate formation in the conventional process.

In the example, the hard mask was formed using 40 $CF_4$/160 Ar (sccm), 10 mTorr, 750 Ws/150 Wb, 8 Torr Back-He, 41 sec.)

Figures 10A, 10B:
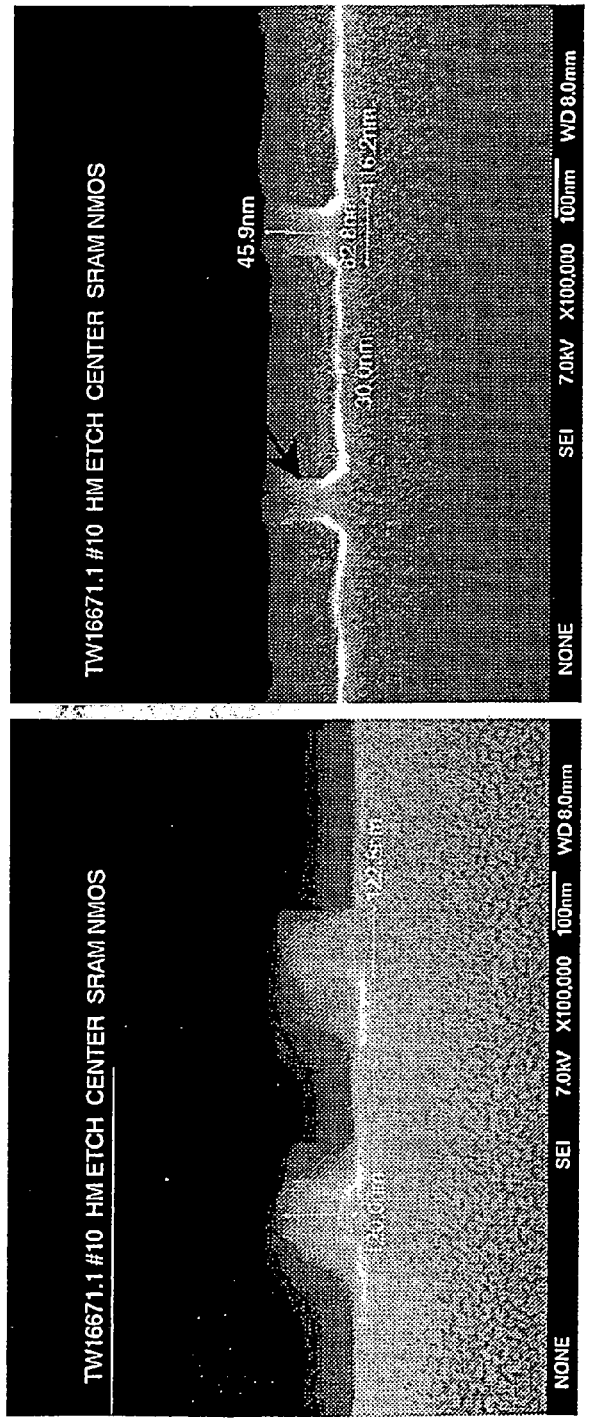
FIGS. 10a and 10b are electron photomicrographs after hard mask formation and photoresist removal for gate etching according to an embodiment of the invention.

FIGS. 10a and 10b are the cross sectional electron photomicrographs after hard mask formation and photoresist removal for gate etching. The results show that notch-free gates are formed having a taper angle of 89 degrees. The poly-Si loss is about 150 Å, while the sub trench effect is less than 50 Å.

As has been shown, the bilayer hard mask of the invention demonstrates clear advantages over the conventional art gate forming technologies. Notching of the gate is avoided. Additionally, undercutting of the gate is kept to a minimum. The result is a semiconductor manufacturing process that is highly advantageous to the 0.18 µm and beyond technologies.

The foregoing embodiments and advantages are merely exemplary and are not to be construed as limiting the present invention. The present teaching can be readily applied to other types of methods and apparatuses. The description of the present invention is intended to be illustrative, and not to limit the scope of the claims. Many alternatives, modifications, and variations will be apparent to those skilled in the art. It is to be understood that the foregoing descriptions and specific embodiments shown herein are merely illustrative of the best mode of the invention and the principles thereof, which is therefore understood to be limited only by the scope of the appended claims.

I claim:
1. A method for manufacturing a semiconductor device, which comprises:
   providing a substrate;
   forming an oxide layer over the substrate;
   forming a silicon layer over the oxide layer;
   forming a hard mask comprising a layer of antireflective coating and a layer of silicon oxide over the silicon layer;
   forming a layer of photoresist over a portion of the silicon layer corresponding to a gate;
   performing a first etching;
   removing the photoresist;
   performing a second etching; and
   removing the hard mask, wherein the second etching process includes the removal of the layer of antireflective coating during gate etching of the silicon layer.

2. The method of claim 1, wherein the antireflective coating comprises silicon oxynitride.

3. The method of claim 1, wherein the second etching removes the antireflective coating.

4. The method of claim 1, wherein the first etching is a dry etch.

5. The method of claim 1, wherein the second etching is a dry etch.

6. The method of claim 1, wherein no notch is formed in the gate.

7. The method of claim 1, wherein the gate undercut is less than about 50 Å.

8. The method of claim 1, wherein the substrate comprises silicon and the oxide layer over the substrate comprises silicon oxide.

9. The method of claim 1, wherein the silicon layer comprises non-doped or n-doped poly-Si.

10. The method of claim 1, wherein the silicon layer has a thickness of about 2000 Å.

11. The method of claim 1, wherein the photoresist is a 248 nm photoresist.

12. The method of claim 1, wherein the layer of silicon oxide has a thickness of about 300–700 Å.

13. The method of claim 1, wherein the antireflective coating has a thickness of about 300–700 Å.

* * * * *